(12) United States Patent
Yun et al.

(10) Patent No.: US 12,566,216 B2
(45) Date of Patent: Mar. 3, 2026

(54) BATTERY APPARATUS AND METHOD FOR ESTIMATING RESISTANCE STATE

(71) Applicant: LG ENERGY SOLUTION, LTD., Seoul (KR)

(72) Inventors: Seongjun Yun, Daejeon (KR); Taekyu Kang, Daejeon (KR); Cheoltaek Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 713 days.

(21) Appl. No.: 17/919,530

(22) PCT Filed: Sep. 14, 2021

(86) PCT No.: PCT/KR2021/012506
§ 371 (c)(1),
(2) Date: Oct. 18, 2022

(87) PCT Pub. No.: WO2022/085950
PCT Pub. Date: Apr. 28, 2022

(65) Prior Publication Data
US 2023/0168307 A1 Jun. 1, 2023

(30) Foreign Application Priority Data
Oct. 22, 2020 (KR) ........................ 10-2020-0137478

(51) Int. Cl.
*G01R 31/389* (2019.01)
*G01R 31/367* (2019.01)
(Continued)

(52) U.S. Cl.
CPC ......... *G01R 31/389* (2019.01); *G01R 31/367* (2019.01); *G01R 31/374* (2019.01);
(Continued)

(58) Field of Classification Search
CPC .. G01R 31/389; G01R 31/367; G01R 31/374; G01R 31/3842; G01R 31/392;
(Continued)

(56) References Cited

U.S. PATENT DOCUMENTS

| | | | | |
|---|---|---|---|---|
| 6,384,608 | B1 * | 5/2002 | Namaky | G01R 31/389 324/430 |
| 6,563,318 | B2 * | 5/2003 | Kawakami | G01R 31/389 324/426 |

(Continued)

FOREIGN PATENT DOCUMENTS

| | | | | | |
|---|---|---|---|---|---|
| CN | 103558556 | B | * | 2/2016 | G01R 31/36 |
| CN | 106461735 | A | * | 2/2017 | H01M 10/48 |

(Continued)

OTHER PUBLICATIONS

Machine Translation Koo Jae-Seung JP2004032977A (Year: 2004).*

(Continued)

*Primary Examiner* — M Baye Diao
(74) *Attorney, Agent, or Firm* — Morgan, Lewis & Bockius LLP

(57) ABSTRACT

A processor of a battery apparatus estimates an internal resistance of a battery at a reference temperature based on a measured voltage of the battery, a measured current of the battery, an open circuit voltage of the battery, and a measured temperature of the battery, and estimates a resistance state of the battery based on the estimated internal resistance and a beginning of life (BOL) resistance at the reference temperature when the battery is in a BOL state.

18 Claims, 4 Drawing Sheets

(51) Int. Cl.

| | | |
|---|---|---|
| *G01R 31/374* | (2019.01) | |
| *G01R 31/3842* | (2019.01) | |
| *H01M 10/42* | (2006.01) | |
| *H01M 10/46* | (2006.01) | |
| *H01M 10/48* | (2006.01) | |
| *H02J 7/00* | (2006.01) | |

(52) U.S. Cl.
CPC ........ *G01R 31/3842* (2019.01); *H01M 10/46* (2013.01); *H01M 10/486* (2013.01); *H02J 7/0047* (2013.01); *H02J 7/0068* (2013.01); *H01M 2010/4271* (2013.01)

(58) Field of Classification Search
CPC .. G01R 27/08; G01R 31/3648; G01R 31/382; G01R 35/00; H01M 10/46; H01M 10/486; H01M 2010/4271; H02J 7/0047; H02J 7/0068; Y02E 60/10
USPC .......................................................... 320/134
See application file for complete search history.

(56) References Cited

U.S. PATENT DOCUMENTS

| | | | | |
|---|---|---|---|---|
| 7,996,167 | B2 * | 8/2011 | Kang .................... | G01R 31/389 |
| | | | | 702/65 |
| 9,846,195 | B2 * | 12/2017 | Lee .......................... | G16Z 99/00 |
| 10,046,664 | B2 * | 8/2018 | Komiyama .......... | G01R 31/389 |
| 10,408,880 | B2 * | 9/2019 | Lin ....................... | G01R 31/367 |
| 10,594,145 | B1 * | 3/2020 | Wang .................... | G01R 31/392 |
| 2005/0269991 | A1 | 12/2005 | Mitsui et al. | |
| 2009/0130538 | A1 | 5/2009 | Kaita et al. | |
| 2011/0172939 | A1 * | 7/2011 | Uprety ................. | G01R 31/389 |
| | | | | 702/63 |
| 2014/0222358 | A1 | 8/2014 | Morita et al. | |
| 2014/0312910 | A1 | 10/2014 | Cho et al. | |
| 2016/0054390 | A1 * | 2/2016 | Lin .......................... | B60L 58/10 |
| | | | | 702/63 |
| 2016/0091573 | A1 * | 3/2016 | Shiraishi .............. | G01R 31/392 |
| | | | | 324/426 |
| 2016/0131720 | A1 | 5/2016 | Baba et al. | |
| 2017/0205468 | A1 | 7/2017 | Park et al. | |
| 2017/0315179 | A1 | 11/2017 | Baba et al. | |
| 2018/0080990 | A1 | 3/2018 | Seo | |
| 2018/0203070 | A1 * | 7/2018 | Park ..................... | G01R 31/392 |
| 2019/0146038 | A1 | 5/2019 | Matsumoto et al. | |
| 2020/0200829 | A1 | 6/2020 | Lee | |
| 2021/0103001 | A1 | 4/2021 | Seo | |

FOREIGN PATENT DOCUMENTS

| | | | | | |
|---|---|---|---|---|---|
| FR | 3009093 | A1 * | 1/2015 | .............. | B60L 58/24 |
| GB | 2461350 | A | 1/2010 | | |

| | | | | | |
|---|---|---|---|---|---|
| JP | 2004032977 | A | * | 1/2004 | ........ H02J 7/007182 |
| JP | 2004-271410 | A | | 9/2004 | |
| JP | 2006-292565 | A | | 10/2006 | |
| JP | 2006-292965 | A | | 10/2006 | |
| JP | 2007-311065 | A | | 11/2007 | |
| JP | 2010-124629 | A | | 6/2010 | |
| JP | 2012-47580 | A | | 3/2012 | |
| JP | 5017084 | B2 | | 9/2012 | |
| JP | 5297751 | B2 | | 9/2013 | |
| JP | 2013-208034 | A | | 10/2013 | |
| JP | 5349567 | B2 | | 11/2013 | |
| JP | 2014-211427 | A | | 11/2014 | |
| JP | 5704120 | B2 | | 4/2015 | |
| JP | 2016-090330 | A | | 5/2016 | |
| JP | 6239241 | B2 | | 11/2017 | |
| JP | 2018-141665 | A | | 9/2018 | |
| JP | 6440377 | B2 | | 12/2018 | |
| JP | 6577990 | B2 | | 9/2019 | |
| KR | 10-0695973 | B1 | | 3/2007 | |
| KR | 10-2011-0081604 | A | | 7/2011 | |
| KR | 10-2014-0125473 | A | | 10/2014 | |
| KR | 20150019190 | A | * | 2/2015 | .......... H01M 10/486 |
| KR | 10-2019-0044399 | A | | 4/2019 | |
| KR | 10-2019-0056743 | A | | 5/2019 | |
| KR | 10-1989692 | B1 | | 6/2019 | |
| WO | 2016/059869 | A1 | | 4/2016 | |

OTHER PUBLICATIONS

A. Guha and A. Patra, "State of Health Estimation of Lithium-Ion Batteries Using Capacity Fade and Internal Resistance Growth Models," in IEEE Transactions on Transportation Electrification, vol. 4, No. 1, pp. 135-146, Mar. 2018 (Year: 2018).*

Partial Supplementary European Search Report issued Oct. 20, 2023 in corresponding European Patent Application No. 21883022.2.

Notice of Reasons for Rejection issued Oct. 31, 2023 in corresponding Japanese Patent Application No. 2022-562648.

International Search Report (with translation) and Written Opinion dated Jan. 7, 2022, issued in corresponding International Application No. PCT/KR2021/012506.

Office Action dated Apr. 16, 2025, issued in corresponding Chinese Patent Application No. 202180026075.5. Note—US 2011/0172939 A1, US 2017/0205468 A1, WO 2016/059869 A1, US 2016/0054390 A1, US 2016/0091573 A1, US 2014/0312910 A1, and KR 10-2011-0081604 A cited in this CN Office Action are already cited in prior IDSs.).

Office Action dated Feb. 4, 2025, issued in corresponding Korean Patent Application No. 10-2020-0137478 (Note—KR 10-2014-0125473 A cited in this KR Office Action was cited in a prior IDS.).

Extended European Search Report dated Feb. 13, 2024, issued in corresponding European Patent Application No. 21883022.2 1. (Note—US 2011/0172939 A1, US 2017/0205468 A1, JP 2006-292565 A, US 2016-0091573 A1, and US 2016/0054390 A1 were cited in prior IDSs.).

* cited by examiner

| Temperature[°C] | Correction ratio |
| --- | --- |
| -30 | 8.33 |
| -20 | 4.00 |
| -10 | 2.50 |
| 0 | 1.67 |
| 10 | 1.25 |
| 25 | 1.00 |
| 40 | 0.91 |
| 50 | 0.88 |
| 60 | 0.87 |
| 70 | 0.86 |

BATTERY APPARATUS AND METHOD FOR ESTIMATING RESISTANCE STATE

TECHNICAL FIELD

Cross-Reference to Related Application

This application claims priority to and the benefit of Korean Patent Application No. 10-2020-0137478 filed in the Korean Intellectual Property Office on Oct. 22, 2020, the entire contents of which are incorporated herein by reference.

The described technology relates to a battery apparatus and a method for estimating a resistance state.

BACKGROUND ART

An electric vehicle or a hybrid vehicle is a vehicle that obtains power by driving a motor mainly using a battery as a power source. The electric vehicles are being actively researched because they are alternatives that can solve pollution and energy problems of internal combustion vehicles. Rechargeable batteries are used in various external apparatuses other than the electric vehicles.

A battery includes a positive electrode, a negative electrode, a separator interposed between the electrodes, and an electrolyte that electrochemically reacts with active materials coated on the positive electrode and negative electrode. A capacity of the battery decreases as charge/discharges cycles increase. The decrease of the capacity may be due to deterioration of the active materials coated on the electrodes, a negative reaction of the electrolyte, and decrease of pores in the separator. As the capacity of the battery decreases, its resistance increases and electric energy dissipated by heat increases. Thus, if the capacity of the battery decreases below a threshold, the performance of the battery significantly deteriorates and the amount of heat generated increases, which requires inspection or replacement of the battery.

In the field of battery technology, the degree of capacity decrease of the battery may be quantified by a factor called a state of health (SOH). The SOH can be calculated in several ways, one of which is calculated by quantifying increase in a resistance of the battery at a current time compared to the resistance in a beginning of life (BOL) state. For example, if the resistance of the battery increases by 20% compared to the resistance in the BOL state, the SOH may be estimated as 80%. Life of the battery can be extended by controlling a maximum current based on the SOH. To realize this, it is necessary to accurately detect an internal resistance of the battery and estimate a state of the internal resistance.

A resistance state, i.e., a degree of deterioration of the resistance may be estimated by quantifying increase in the resistance estimated at a condition including a specific temperature and a specific SOC compared to the resistance in the BOL state of the battery, based on previously-measured resistance data. Further, under the assumption that the internal resistance is deteriorated to the same level even at a temperature or SOC different from the specific temperature or the specific SOC, the estimated resistance state is applied to all conditions to be used to estimate an output. However, the resistance of the battery may vary depending on the temperature. Accordingly, if the estimated resistance at the specific temperature is applied to other temperatures, a result different from the actual resistance state may occur.

DISCLOSURE

Technical Problem

Some embodiments may provide a battery apparatus and a method for estimating a resistance state, for accurately estimating an internal resistance and a resistance state of a battery.

Technical Solution

According to an embodiment, a battery apparatus including a battery and a processor may be provided. The processor may estimate an internal resistance of the battery at a reference temperature based on a measured voltage of the battery, a measured current of the battery, an open circuit voltage of the battery, and a measured temperature of the battery, and estimate a resistance state of the battery based on the estimated internal resistance and a beginning of life (BOL) resistance at the reference temperature when the battery is in a BOL state.

In some embodiments, the battery apparatus may further include a memory configured to store a plurality of correction ratios respectively corresponding to a plurality of temperatures. The processor may extract a correction ratio corresponding to the measured temperature from among the plurality of correction ratios, and estimate the internal resistance at the reference temperature based on the measured voltage, the measured current, the open circuit voltage, and the correction ratio.

In some embodiments, the correction ratio may be a value for converting a resistance at the measured temperature into a resistance at the reference temperature.

In some embodiments, the processor may estimate the internal resistance at the reference temperature based on the measured voltage, a current obtained by reflecting the correction ratio in the measured current, and the open circuit voltage.

In some embodiments, the processor may estimate the internal resistance at the reference temperature based on an adaptive filter that uses an observation including the measured voltage and the open circuit voltage, an estimation parameter including the internal resistance, and an observation matrix including the measured current and the correction ratio.

In some embodiments, the correction ratio may be reflected in the measured current in the observation matrix.

In some embodiments, the adaptive filter may include a recursive least squares (RLS) filter.

In some embodiments, the processor may estimate a state of charge of the battery and estimate the open circuit voltage based on the state of charge.

In some embodiments, the processor may estimate the resistance state by quantifying an increase in the internal resistance at the reference temperature compared to the BOL resistance at the reference temperature.

According to another embodiment, a method of estimating a resistance state of a battery may be provided. The resistance state estimation method includes estimating an internal resistance of the battery at a reference temperature based on a measured voltage of the battery, a measured current of the battery, an open circuit voltage of the battery, and a measured temperature of the battery, and estimating the resistance state of the battery based on the internal resistance and a BOL resistance at a reference temperature when the battery is in a BOL state.

According to yet another embodiment of the present invention, a program configured to be executed by a processor of a battery apparatus and be stored in a recording medium may be provided. The program may cause the processor to execute estimating an internal resistance of the battery at a reference temperature based on a measured voltage of the battery, a measured current of the battery, an open circuit voltage of the battery, and a measured temperature of the battery, and estimating the resistance state of the battery based on the internal resistance and a BOL resistance at a reference temperature when the battery is in a BOL state.

Advantageous Effects

According to some embodiments, it is possible to accurately estimate an internal resistance and a resistance state of a battery regardless of a change in a temperature.

MODES FOR INVENTION

Figure 1:
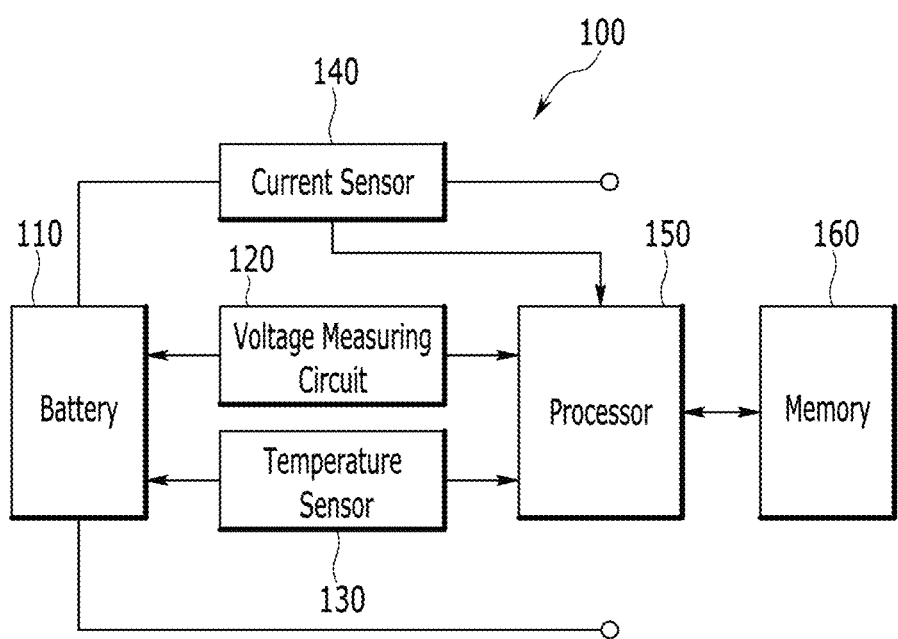
FIG. 1 is a drawing showing a battery apparatus according to an embodiment.

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

As used herein, a singular form may be intended to include a plural form as well, unless the explicit expression such as "one" or "single" is used.

In flowcharts described with reference to the drawings, the order of operations or steps may be changed, several operations or steps may be merged, a certain operation or step may be divided, and a specific operation or step may not be performed.

FIG. 1 is a drawing showing a battery apparatus according to an embodiment.

Referring to FIG. 1, a battery apparatus 100 has a structure that can be electrically connected to an external apparatus. When the external apparatus is a load, the battery apparatus 100 is discharged by operating as a power supply that supplies power to the load. When the external apparatus is a charger, the battery apparatus 100 is charged by receiving external power through the charger. The external apparatus operating as the load may be, for example, an electronic device, a mobility apparatus, or an energy storage system (ESS). The mobility apparatus may be, for example, an electric vehicle, a hybrid vehicle, or a smart mobility.

The battery apparatus 100 includes a battery 110, a voltage measuring circuit 120, a temperature sensor 130, a current sensor 140, a processor 150, and a memory 160.

The battery 110 is a rechargeable battery. The battery 100 may be a single battery cell, a battery module including an assembly of a plurality of battery cells or in which a plurality of assemblies are connected in series or parallel, a battery pack in which a plurality of battery modules are connected in series or parallel, or a system in which a plurality of battery packs are connected in series or parallel.

The voltage measuring circuit 120 measures a voltage of the battery 110. In some embodiments, the voltage measurement circuit 120 may measure a voltage of each battery cell.

The temperature sensor 130 measures a temperature of the battery 110. In some embodiments, the temperature sensor 130 may measure a temperature at a predetermined location of the battery 110. In some embodiments, a plurality of temperature sensors 130 may be provided to measure temperatures at a plurality of locations in the battery 110.

The current sensor 140 is connected to a positive terminal or negative terminal of the battery 110, and measures a current of the battery 110, i.e., a charging current or a discharging current.

The processor 150 estimates a resistance state of the battery 110 based on the voltage of the battery 110 measured by the voltage measuring circuit 120, the temperature of the battery 110 measured by the temperature sensor 130, and the current of the battery 110 measured by the current sensor 140. In some embodiments, the processor 150 may refer to a table stored in the memory 160 for estimating the resistance state of the battery 110.

The memory 160 stores the table used for estimating the resistance state of the processor 150. In some embodiments, the memory 160 may store instructions used in operations of the processor 150. In some embodiments, the memory 160 may be embedded in the processor 150 or connected to the processor 150 via a bus. In some embodiments, the memory 160 storing the table may be a non-volatile memory.

In some embodiments, the processor 150 and the memory 160 may form a battery management system. In some embodiments, the battery management system may further include at least one of the voltage measurement circuit 120, the temperature sensor 130, or the current sensor 140.

Figure 2:
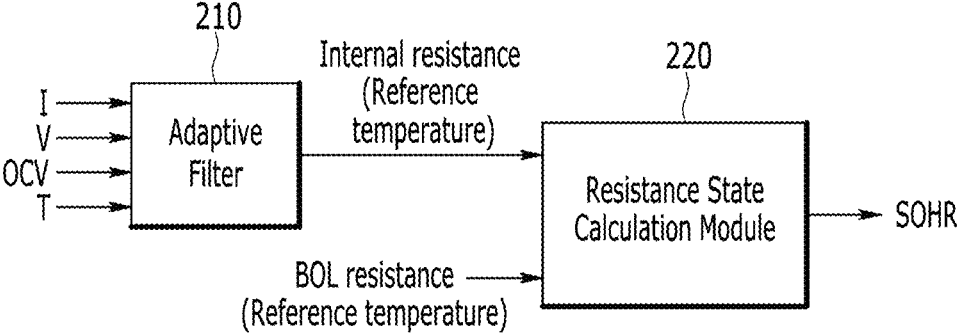
FIG. 2 is a diagram for explaining resistance state estimation in a battery management system according to an embodiment.
Figure 3:
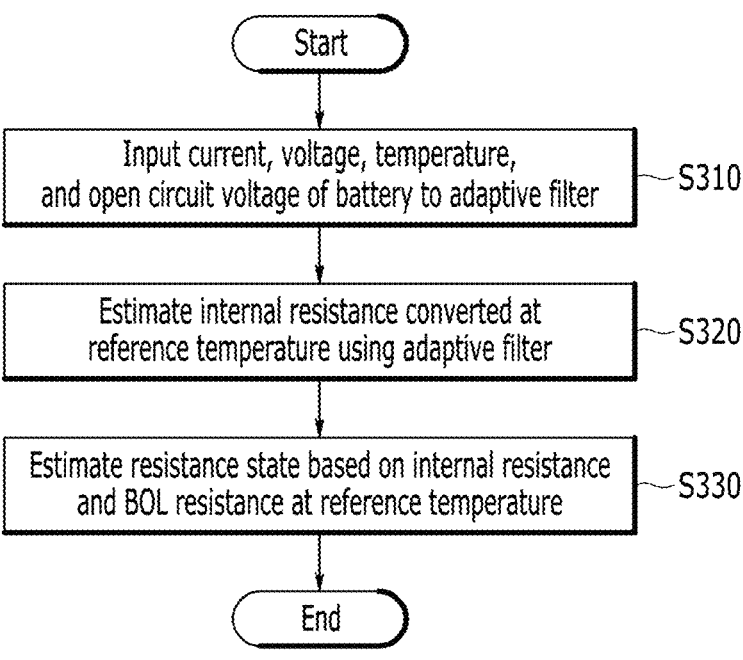
FIG. 3 is a flowchart showing a resistance state estimation method in a battery management system according to an embodiment.
Figures 4, 5:
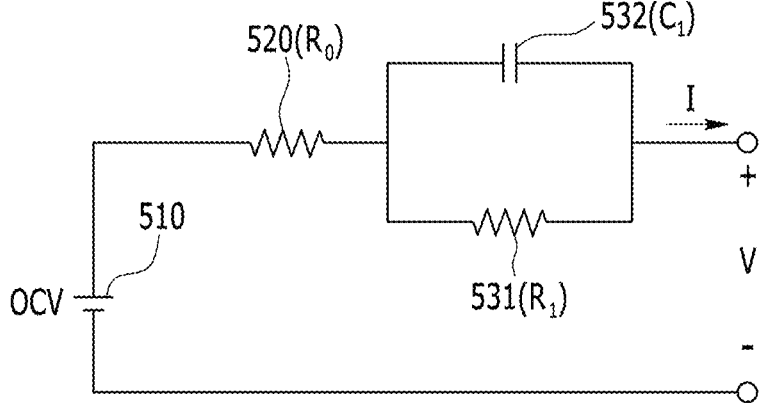
FIG. 4 is a diagram showing an example of a correspondence relationship between a temperature and a correction ratio in a battery according to an embodiment.
FIG. 5 is a diagram showing an equivalent circuit model of a battery according to an embodiment.

FIG. 2 is a diagram for explaining resistance state estimation in a battery management system according to an embodiment, and FIG. 3 is a flowchart showing a resistance state estimation method in a battery management system according to an embodiment. FIG. 4 is a diagram showing an example of a correspondence relationship between a temperature and a correction ratio in a battery according to an embodiment, and FIG. 5 is a diagram showing an equivalent circuit model of a battery according to an embodiment.

Referring to FIG. 2 and FIG. 3, a processor (e.g., 150 in FIG. 1) of a battery management system estimates an internal resistance (ohmic resistance) of a battery (e.g., 110 in FIG. 1) using an adaptive filter 210 at S310 and S320. The processor 150 may input a current I of the battery 110, a voltage V of the battery 110, an open circuit voltage OCV of the battery 110, and a temperature T of the battery 110 to the adaptive filter 210 at S310, and estimate an internal resistance converted (i.e., normalized) at a reference temperature using the adaptive filter 210 based on the inputted values at S320. In some embodiments, the reference temperature may be a room temperature (e.g., 25° C.). In some embodiments, the current of the battery 110 may be a charging or discharging current of the battery 110 measured by a current sensor (e.g., 140 in FIG. 1). In some embodiments, the voltage of the battery 110 may be a voltage of a battery cell. In some embodiments, the voltage of the battery 110 may be an average cell voltage, and the average cell voltage may be an average value of voltages of a plurality of battery cells. In some embodiments, the voltage of the battery 110 may be a sum of voltages of the plurality of battery cells. The open circuit voltage of the battery 110 may be a value converted from an average state of charge of the battery 110. In some embodiments, the temperature of the battery 110 may be a temperature measured by a temperature sensor (e.g., 130 in FIG. 1). In some embodiments, the temperature of the battery 110 may be an average temperature that is an average value of temperatures measured by a plurality of temperature sensors.

The processor 150 may estimate an internal resistance at the reference temperature using the adaptive filter 210 based on a correction ratio. In some embodiments, the correction ratio is a value for converting a resistance at the measured temperature into the resistance at the reference temperature, and may be defined as, for example, a ratio of the resistance at a current temperature and the resistance converted at the reference temperature as in Equation 1.

$$R_0^* = \frac{R_0(T)}{r(T)}$$      Equation 1

In Equation 1, $R_0^*$ is the resistance at the reference temperature, $r(T)$ is the correction ratio at the temperature T, and $R_0(T)$ is the resistance at the temperature T.

In some embodiments, a correspondence relationship between the temperature and the correction ratio may be stored as shown in FIG. 4. That is, a plurality of correction ratios respectively corresponding to a plurality of temperatures may be stored. For example, the correspondence relationship may be stored in the form of a lookup table. In some embodiments, a memory (e.g., 160 in FIG. 1) of the battery management system may store the correspondence relationship. The correspondence relationship between the temperature and the correction ratio shown in FIG. 4 is an example, and the value of the correction ratio according to the temperature may be defined, for example, through experiments. As shown in FIG. 4, the correction ratio may be 1 at the reference temperature (e.g., 25° C.), and decrease as the temperature increases. Accordingly, the resistance at a temperature lower than the reference temperature may be greater than the resistance at the reference temperature, and the resistance at a temperature higher than the reference temperature may be less than the resistance at the reference temperature.

Referring to FIG. 5, an equivalent circuit model of the battery includes an open circuit voltage source 510, a series resistor 520, and an RC parallel circuit.

The open circuit voltage source 510 simulates an open circuit voltage, which is a voltage between positive and negative electrodes of an electrochemically stabilized battery. The open circuit voltage may be determined based on a state of charge (SOC) of the battery 110 and may have a non-linear functional relationship OCV=f(SOC) with the SOC. In some embodiments, a correspondence relationship between the open circuit voltage of the battery 110 and the SOC may be stored. For example, the correspondence relationship may be stored in the form of a lookup table. In some embodiments, a memory (e.g., 160 in FIG. 1) of the battery management system may store the correspondence relationship. In some other embodiments, the correspondence relationship between the open circuit voltage of the battery 110 and the SOC may be stored per temperature. Accordingly, the processor 150 may refer to the correspondence relationship stored in the memory 160 to determine the open circuit voltage associated with the SOC.

In some embodiments, the processor 150 may determine the SOC of the battery 110 based on the voltage of the battery 110, the current of the battery 110, or the temperature of the battery 110. The processor 150 may determine the SOC using any one of various known methods, and the present invention is not limited to a method of determining the SOC.

The series resistor 520 simulates an internal resistance of the battery 110 representing a voltage drop inside the battery 110 due to a current flowing through the battery 110, and represents an instantaneous change in a terminal voltage of the battery due to the current flowing through the battery 110. The RC parallel circuit simulates a transient change in a polarization voltage (i.e., an over-potential) reflected in the battery terminal voltage and includes a resistor 531 and a capacitor 532 connected in parallel.

In the equivalent circuit model, the battery terminal voltage V may be given as in Equation 2. In some embodiments, the battery terminal voltage V may be a voltage of a battery cell or an average cell voltage.

$$V = (R_0 + R_1)I + R_0\tau_1\frac{dI}{dt} - \tau_1\frac{dV}{dt} + OCV$$      Equation 2

In Equation 2, $R_0$ is a resistance of the internal resistor (ohmic resistor) 520, $R_1$ is a resistance of the resistor 531 of the RC parallel circuit, $\tau_1$ is a time constant of the RC parallel circuit, I is the current of the battery 110, and OCV is the open circuit voltage.

Referring to FIG. 2 and FIG. 3 again, the processor 150 calculates a resistance state based on the internal resistance of the battery 110, which is estimated by the adaptive filter 210 by using the resistance state calculation module 220, and a beginning of life (BOL) resistance at the reference temperature in S330. The BOL resistance may be an internal resistance when the battery is in a BOL state. The BOL resistance may vary depending on the temperature of the battery, and the processor 150 may store the BOL resistance at the reference temperature. In some embodiments, the processor 150 may store the BOL resistance at the reference temperature in a memory (e.g., 160 in FIG. 1) of the battery management system.

In some embodiments, the processor 150 may estimate the resistance state (e.g., state of health resistance (SOHR)) as a value obtained by subtracting a ratio of an increase in the internal resistance compared to the BOL resistance from 100% as in Equation 3. Such a resistance state may be referred to as a resistance deterioration state.

$$SOHR[\%] = 100 - \frac{R_0 - R_{BOL}}{R_{BOL}} \cdot 100$$      Equation 3

In Equation 3, $R_0$ is the estimated internal resistance of the battery, and $R_{BOL}$ is the BOL resistance at the reference temperature.

According to the above-described embodiments, the internal resistance converted at the reference temperature may be estimated by inputting information measured from the battery into the adaptive filter 210. Further, since the estimated internal resistance is compared with the BOL resistance at the reference temperature to determine how much the estimated internal resistance is deteriorated, the resistance state can be accurately estimated regardless of a change in the temperature of the battery.

Next, an example of a method of estimating an internal resistance using the adaptive filter 210 is described with reference to FIG. 6. In some embodiments, a recursive least squares (RLS) filter may be used as the adaptive filter 210. Hereinafter, the adaptive filter 210 is described as the RLS filter.

Figure 6:
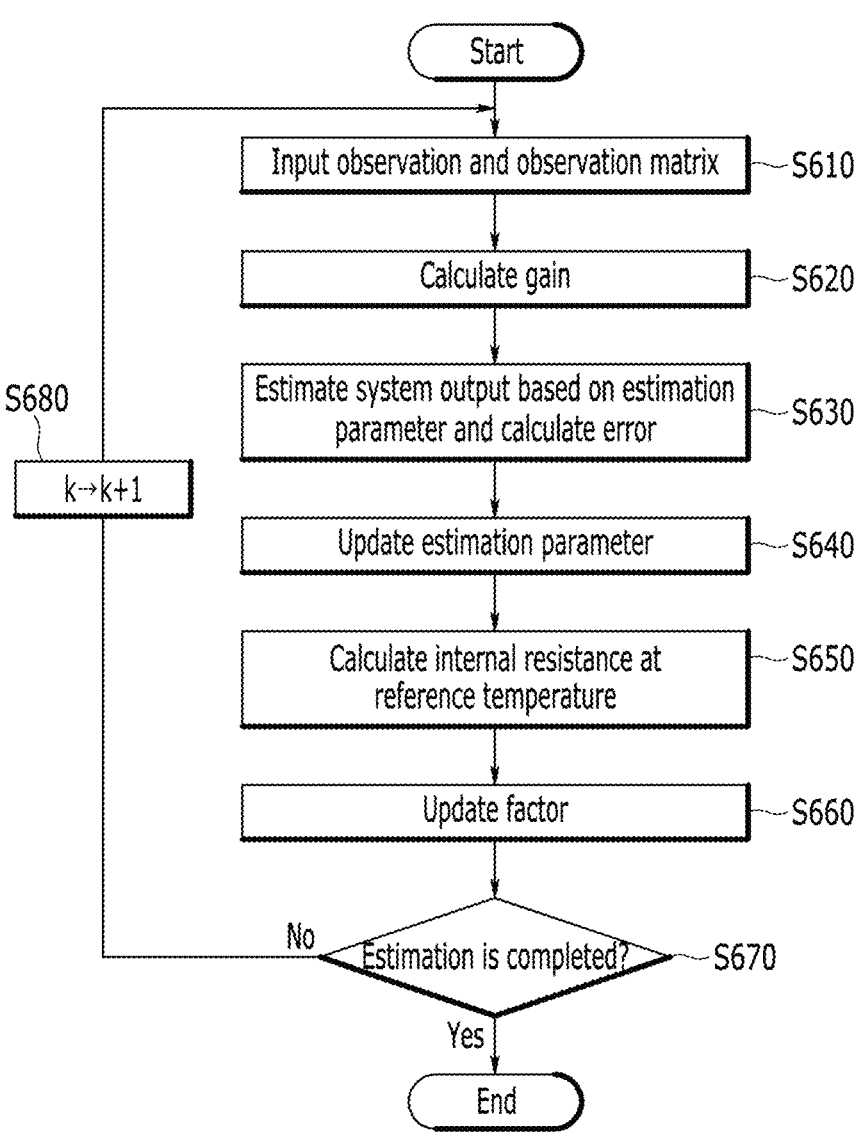
FIG. 6 is a flowchart showing a method for estimating an internal resistance in a battery management system according to an embodiment.

FIG. 6 is a flowchart showing a method for estimating an internal resistance in a battery management system according to an embodiment.

A processor 150 converts a battery terminal voltage V in an equivalent circuit model based on a reference temperature in order to estimate an internal resistance converted at the reference temperature. In this case, Equation 2 may be converted into Equation 4.

$$V = (R_0^* + R_1^*)rI + R_0^*\tau_1 r\frac{dI}{dt} - \tau_1\frac{dV}{dt} + OCV \qquad \text{Equation 4}$$

In Equation 4, $R_0^*$ is a resistance into which the internal resistance is converted at the reference temperature, $R_1^*$ is a resistance into which a resistance of an RC parallel circuit is converted at the reference temperature, and r is a correction ratio.

Equation 4 may be expressed as Equation 5.

$$V - OCV = (R_0^* + R_1^*)rI + R_0^*\tau_1 r\frac{dI}{dt} - \tau_1\frac{dV}{dt} \qquad \text{Equation 5}$$

When Equation 5 is expressed as a matrix equation such as Equation 6, an observation, i.e., a system output $y_k$ at time k indicating a current time may be expressed as in Equation 7, an estimation parameter may be expressed as in Equation 8, and an observation matrix $H_k$ at time k may be expressed as in Equation 9. Accordingly, the processor 150 inputs the system output $y_k$ measured at time k and the observation matrix $H_k$ to the adaptive filter 210 at S610.

$$y = H\hat{x} \qquad \text{Equation 6}$$

$$y_k = V_k - OCV_k \qquad \text{Equation 7}$$

$$\hat{x}_k = \begin{bmatrix} R_0^* + R_1^* \\ R_0^*\tau_1 \\ -\tau_1 \end{bmatrix} \qquad \text{Equation 8}$$

$$H_k = \begin{bmatrix} rI_k & \dfrac{rdI_k}{dt} & \dfrac{dV_k}{dt} \end{bmatrix} \qquad \text{Equation 9}$$

In Equations 7 and 9, $V_k$ is a voltage of the battery (e.g., average cell voltage) measured at time k, $OCV_k$ is an open circuit voltage estimated based on SOC at time k, and $I_k$ is a current of the battery measured (e.g., a current measured by a current sensor) at time k. As shown in Equation 9, a current obtained by reflecting the correction ratio r in the current $I_k$ of the battery 110 may be used to estimate the internal resistance converted at the reference temperature.

The adaptive filter 210 calculates a gain $K_k$ at S620. In some embodiments, the adaptive filter 210 may calculate the gain $K_k$ for minimizing a cost function that is determined based on a forgetting factor and an error between the observation, i.e., the voltage of the battery measured at time k and the voltage of the battery estimated based on Equation 6. In some embodiments, the cost function may be determined based on a least squares error weighted by the forgetting factor. For example, the adaptive filter 210 may calculate the gain $K_k$ as in Equation 10.

$$K_k = P_{k-1}H_k^T(H_k P_{k-1}H_k^T + \lambda)^{-1} \qquad \text{Equation 10}$$

In Equation 10, $P_{k-1}$ represents a covariance, and A represents the forgetting factor. In some embodiments, the covariance $P_{k-1}$ may be a value updated at time k−1 as in Equation 14.

The adaptive filter 210 estimates the system output at time k based on the estimation parameter at time k−1 at S630. The estimated system output may be given as in, for example, Equation 11. Further, the adaptive filter 210 calculates an error between the actual system output $y_k$ and the estimated output at time k at S630. The error may be given as in, for example, Equation 12. Accordingly, the adaptive filter 210 updates the estimation parameter at time k by reflecting the gain in the error at S640. For example, the adaptive filter 210 may update the estimation parameter as in Equation 13.

$$H_k\hat{x}_{k-1} \qquad \text{Equation 11}$$

$$y_k - H_k\hat{x}_{k-1} \qquad \text{Equation 12}$$

$$\hat{x}_k = \hat{x}_{k-1} + K_k(y_k - H_k\hat{x}_{k-1}) \qquad \text{Equation 13}$$

The adaptive filter 210 calculates the resistance $R_0^*$ into which the internal resistance is converted at the reference temperature, based on the updated estimation parameter at S650.

Meanwhile, for the calculation of Equations 10 and 13, an initial value of the estimation parameter when k is 0 and an initial value $P_0$ of the covariance may be predefined.

Next, the adaptive filter 210 updates a factor to be used at time k+1 at S660. In some embodiments, the adaptive filter 210 may update the covariance $P_k$ to be used at time k+1. For example, the adaptive filter 210 may update the covariance $P_k$ as in Equation 14. In some embodiments, the adaptive filter 210 may further update the forgetting factor $\lambda$. For example, the adaptive filter 210 may update the forgetting factor A based on the previously calculated error.

$$P_k = \frac{(I - K_k H_k)P_{k-1}}{\lambda} \qquad \text{Equation 14}$$

Through such a process, the RLS filter estimates the resistance $R_0$ into which the internal resistance is converted at the reference temperature at each time k, updates the factors to be used for estimation (e.g., the covariance, the forgetting factor), and provides the updated factors to the estimation at a next time k+1. Accordingly, when the estimation of the internal resistance is not completed at S670, the adaptive filter 210 may continue the estimation at the next time at S680.

The internal resistance estimation method described with reference to FIG. 6 is an example of using the RLS filter as the adaptive filter 210, and the present invention is not limited thereto.

According to the above-described embodiments, when estimating the internal resistance by inputting information measured from the battery to the adaptive filter 210, the internal resistance converted at the reference temperature can be estimated. Further, since the resistance state is estimated by comparing the estimated internal resistance with the BOL resistance at the reference temperature, a change in the resistance due to the temperature can be offset. That is, the resistance state can be estimated based on the reference temperature regardless of the current temperature of the battery.

In some embodiments, the processor (e.g., 150 of FIG. 1) may perform a computation on a program for executing the resistance state estimation method or the internal resistance estimation method described above. A program for executing the resistance state estimation method or the internal resistance estimation method may be loaded into the memory. The memory may be the same memory as a memory (e.g., 160 in FIG. 1) for storing a table or a separate memory. The program may include instructions for causing the processor 150 to perform the resistance state estimation method or the internal resistance estimation method when loaded into a memory. That is, the processor may perform an operation for the resistance state estimation method or the internal resistance estimation method by executing the instruction of the program.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery apparatus, comprising:
a battery;
a memory configured to store a plurality of correction ratios respectively corresponding to a plurality of temperatures; and
a processor configured to:
extract a correction ratio corresponding to a measured temperature of the battery from among the plurality of correction ratios stored in the memory;
estimate an internal resistance of the battery at a reference temperature based on a measured voltage of the battery, a measured current of the battery, an open circuit voltage of the battery, and the correction ratio; and
estimate a resistance state of the battery based on the estimated internal resistance and a beginning of life (BOL) resistance of the battery in a BOL state at the reference temperature.

2. The battery apparatus of claim 1, wherein the correction ratio is a value for converting a resistance at the measured temperature into a resistance at the reference temperature.

3. The battery apparatus of claim 1, wherein the processor is further configured to estimate the internal resistance at the reference temperature based on the measured voltage, a current obtained by reflecting the correction ratio in the measured current, and the open circuit voltage.

4. The battery apparatus of claim 1, wherein the processor is further configured to estimate the internal resistance at the reference temperature based on an adaptive filter that uses an observation including the measured voltage and the open circuit voltage, an estimation parameter including the internal resistance, and an observation matrix including the measured current and the correction ratio.

5. The battery apparatus of claim 4, wherein the correction ratio is reflected in the measured current in the observation matrix.

6. The battery apparatus of claim 4, wherein the adaptive filter includes a recursive least squares (RLS) filter.

7. The battery apparatus of claim 1, wherein the processor is further configured to estimate a state of charge of the battery and estimate the open circuit voltage based on the state of charge.

8. The battery apparatus of claim 1, wherein the processor is further configured to estimate the resistance state by quantifying an increase in the estimated internal resistance at the reference temperature compared to the BOL resistance at the reference temperature.

9. The battery apparatus of claim 1, further comprising:
a voltage measuring circuit to provide the measured voltage of the battery;
a temperature sensor to provide the measured temperature of the battery; and
a current sensor to provide the measured current of the battery.

10. The battery apparatus of claim 9, wherein the current sensor is connected to a positive terminal or a negative terminal of the battery and is configured to measure a charging current or a discharging current of the battery.

11. The battery apparatus of claim 1, wherein the processor is further configured to control a maximum current of the battery based on the resistance state of the battery.

12. A method of estimating a resistance state of a battery, the method comprising:
extracting a correction ratio corresponding to a measured temperature of the battery from among a plurality of correction ratios stored in a memory and respectively corresponding to a plurality of temperatures;
estimating an internal resistance of the battery at a reference temperature based on a measured voltage of the battery, a measured current of the battery, an open circuit voltage of the battery, and the correction ratio; and
estimating the resistance state of the battery based on the estimated internal resistance and a beginning of life (BOL) resistance of the battery in a BOL state at the reference temperature.

13. The method of claim 12, wherein the correction ratio is a value for converting a resistance at the measured temperature into a resistance at the reference temperature.

14. The method of claim 12, wherein the estimating of the internal resistance includes estimating the internal resistance at the reference temperature based on the measured voltage, a current obtained by reflecting the correction ratio in the measured current, and the open circuit voltage.

15. The method of claim 12, wherein the estimating of the resistance state includes estimating the resistance state by quantifying an increase in the estimated internal resistance at the reference temperature compared to the BOL resistance at the reference temperature.

16. The method of claim 12, further comprising controlling a maximum current of the battery based on the resistance state of the battery.

17. A program configured to be executed by a processor of a battery apparatus and be stored in a non-transitory recording medium, wherein the program causes the processor to execute:
extracting a correction ratio corresponding to a measured temperature of the battery from among a plurality of correction ratios stored in the non-transitory recording medium and respectively corresponding to a plurality of temperatures;

estimating an internal resistance of the battery at a reference temperature based on a measured voltage of the battery, a measured current of the battery, an open circuit voltage of the battery, and the correction ratio; and estimating a resistance state of the battery based on the estimated internal resistance and a beginning of life (BOL) resistance of the battery in a BOL state at the reference temperature.

18. The program of claim 17, causing the processor to further execute controlling a maximum current of the battery based on the resistance state of the battery.

* * * * *